United States Patent
Iizuka et al.

(10) Patent No.: US 8,253,112 B2
(45) Date of Patent: Aug. 28, 2012

(54) LITHOGRAPHY APPARATUS AND FOCUSING METHOD FOR CHARGED PARTICLE BEAM

(75) Inventors: Osamu Iizuka, Kanagawa (JP); Kenji Ohtoshi, Kanagawa (JP)

(73) Assignee: Nuflare Technology, Inc., Numazu-shi (JP)

(*) Notice: Subject to any disclaimer, the term of this patent is extended or adjusted under 35 U.S.C. 154(b) by 586 days.

(21) Appl. No.: 12/489,606

(22) Filed: Jun. 23, 2009

(65) Prior Publication Data

US 2009/0314950 A1    Dec. 24, 2009

(30) Foreign Application Priority Data

Jun. 24, 2008 (JP) .................................. 2008-164140

(51) Int. Cl.
*G21K 5/04* (2006.01)

(52) U.S. Cl. ................. 250/396 R; 250/397; 250/492.1; 250/492.3

(58) Field of Classification Search ............. 250/396 R, 250/397, 398, 396 ML, 492.2, 492.22, 492.23, 250/492.3
See application file for complete search history.

(56) References Cited

U.S. PATENT DOCUMENTS

| | | | | |
|---|---|---|---|---|
| 4,393,310 | A * | 7/1983 | Hahn | ........................... 250/398 |
| 6,207,965 | B1 * | 3/2001 | Koike | ..................... 250/492.23 |
| 2002/0005491 | A1 * | 1/2002 | Yagi et al. | .............. 250/396 ML |
| 2007/0158567 | A1 * | 7/2007 | Nakamura et al. | ............ 250/311 |
| 2008/0310704 | A1 * | 12/2008 | Tachibana et al. | ............ 382/148 |

FOREIGN PATENT DOCUMENTS

JP    2007-43083    2/2007

* cited by examiner

*Primary Examiner* — David A Vanore
*Assistant Examiner* — Nicole Ippolito
(74) *Attorney, Agent, or Firm* — Oblon, Spivak, McClelland, Maier & Neustadt, L.L.P.

(57) ABSTRACT

A lithography apparatus includes a unit irradiating a charged particle beam; first and second aperture plate members configured to shape the beam; first and second coils configured to be arranged between the unit and the first aperture plate member, to temporarily deflect the beam, to change a direction of the beam after the temporarily deflecting, and to deflect the beam to a position where the beam passes through the first aperture plate member by the changing; a lens configured to be arranged between the first and second aperture plate members and to control a focal position of the beam having passed through the first aperture plate member; and a unit configured to calculate a difference between positions of the beam on the second aperture plate member obtained by different sets of amounts of deflection at a same focal position when a combination of one of focal positions of the beam controlled by the lens and one of sets of amounts of deflection of the beam obtained by the first and second coils is changed.

10 Claims, 8 Drawing Sheets

LITHOGRAPHY APPARATUS AND FOCUSING METHOD FOR CHARGED PARTICLE BEAM

CROSS-REFERENCE TO RELATED APPLICATION

This application is based upon and claims the benefit of priority from prior Japanese Patent Application No. 2008-164140 filed on Jun. 24, 2008 in Japan, the entire contents of which are incorporated herein by reference.

BACKGROUND OF THE INVENTION

1. Field of the Invention

The present invention relates to a lithography apparatus and a focusing method for a charged particle beam, for example, a variable-shaped electron beam lithography apparatus using first and second aperture plate members and a focusing method for the electron beam.

2. Related Art

A lithography technique which leads development of micropatterning of a semiconductor device is a very important process for exclusively generating a pattern in semiconductor manufacturing processes. In recent years, with an increase in integration density of an LSI, a circuit line width required for a semiconductor device is getting smaller year by year. In order to form a desired circuit pattern on such a semiconductor device, a high-precision original pattern (also called a reticle or a mask) is necessary. In this case, an electron beam lithography technique essentially has an excellent resolution, and is used in production of high-precision original patterns.

FIG. 9 is a conceptual diagram for explaining an operation of a variable-shaped electron beam lithography apparatus.

The variable-shaped electron beam (EB: Electron Beam) lithography apparatus operates as described below. In a first aperture plate 410, a quadrangular, for example, rectangular opening 411 to shape an electron beam 330 is formed. In a second aperture plate 420, a variable-shaped opening 421 to shape the electron beam 330 having passed through the opening 411 of the first aperture plate 410 into a desired quadrangular shape is formed. The electron beam 330 irradiated from the charged particle source 430 and having passed through the opening 411 of the first aperture plate 410 is deflected by a deflector, passes through a part of the variable-shaped opening 421 of the second aperture plate 420, and is irradiated on a sample 340 placed on a stage continuously moving in one predetermined direction (for example, X direction). More specifically, a quadrangular shape which can pass through both the opening 411 of the first aperture plate 410 and the variable-shaped opening 421 of the second aperture plate 420 is lithographed in a lithography region on the sample 340 placed on the stage continuously moving in the X direction (for example, see Published Unexamined Japanese Patent Application No. 2007-043083). The scheme for causing a beam to pass through both the opening 411 of the first aperture plate 410 and the variable-shaped opening 421 of the second aperture plate 420 to form an arbitrary shape is called a variable-shaping scheme.

In the variable-shaped electron beam lithography apparatus, as described above, a beam is caused to pass through both the opening 411 of the first aperture plate 410 and the variable-shaped opening 421 of the second aperture plate 420 to shape the beam to be lithographed. For this reason, in order to perform high-precision shaping, a first aperture image is required to be focused on the second aperture plate. However, as a focusing method between the first and second aperture plates in an imaging system, a method of performing focusing with sufficient precision is not established.

As described above, a method of performing focusing with sufficient precision between the first and second aperture plates is not established.

BRIEF SUMMARY OF THE INVENTION

According to embodiments of the present invention, there is provided a method of performing focusing between first and second aperture plates and an apparatus therefor.

In accordance with one aspect of the present invention, a lithography apparatus includes an irradiating unit configured to irradiate a charged particle beam; first and second aperture plate members configured to shape the charged particle beam; first and second coils configured to be arranged between the irradiating unit and the first aperture plate member, to temporarily deflect the charged particle beam, to change a direction of the charged particle beam after the temporarily deflecting, and to deflect the charged particle beam to a position where the charged particle beam passes through the first aperture plate member by the changing; a lens configured to be arranged between the first and second aperture plate members and to control a focal position of the charged particle beam having passed through the first aperture plate member; and a calculating unit configured to calculate a difference between positions of the charged particle beam on the second aperture plate member obtained by different sets of amounts of deflection at a same focal position when a combination of one of focal positions of the charged particle beam controlled by the lens and one of sets of amounts of deflection of the charged particle beam obtained by the first and second coils is changed.

In accordance with another aspect of this invention, a focusing method for a charged particle beam includes irradiating a charged particle beam; temporarily deflecting the charged particle beam by a first coil and deflecting the charged particle beam by a second coil to a position where the charged particle beam passes through a first aperture plate member after the temporarily deflecting by the first coil; measuring a position of the charged particle beam on a second aperture plate member in combinations of one of focal positions of the charged particle beam controlled by a lens arranged between the first aperture plate member and the second aperture plate member and one of sets of amounts of deflection of the charged particle beam obtained by the first and second coils when the combinations are changed; and adjusting a focal point of the charged particle beam to a focal position where a difference between positions of the charged particle beam obtained by different sets of amounts of deflection at a same focal position on the second aperture plate member or a sum of squares of differences between positions of the charged particle beam obtained by different sets of amounts of deflection at a same focal position on the second aperture plate member in directions of two-dimensional directions is smaller.

DETAILED DESCRIPTION OF THE INVENTION

A configuration using an electron beam as an example of a charged particle beam will be described in each of the embodiments as described below. The charged particle beam is not limited to an electron beam. A beam such as an ion beam using charged particles may be used. As an example of a charged particle beam lithography apparatus, in particular, a variable-shaped electron beam lithography apparatus will be described below.

Embodiment 1

Figure 1:
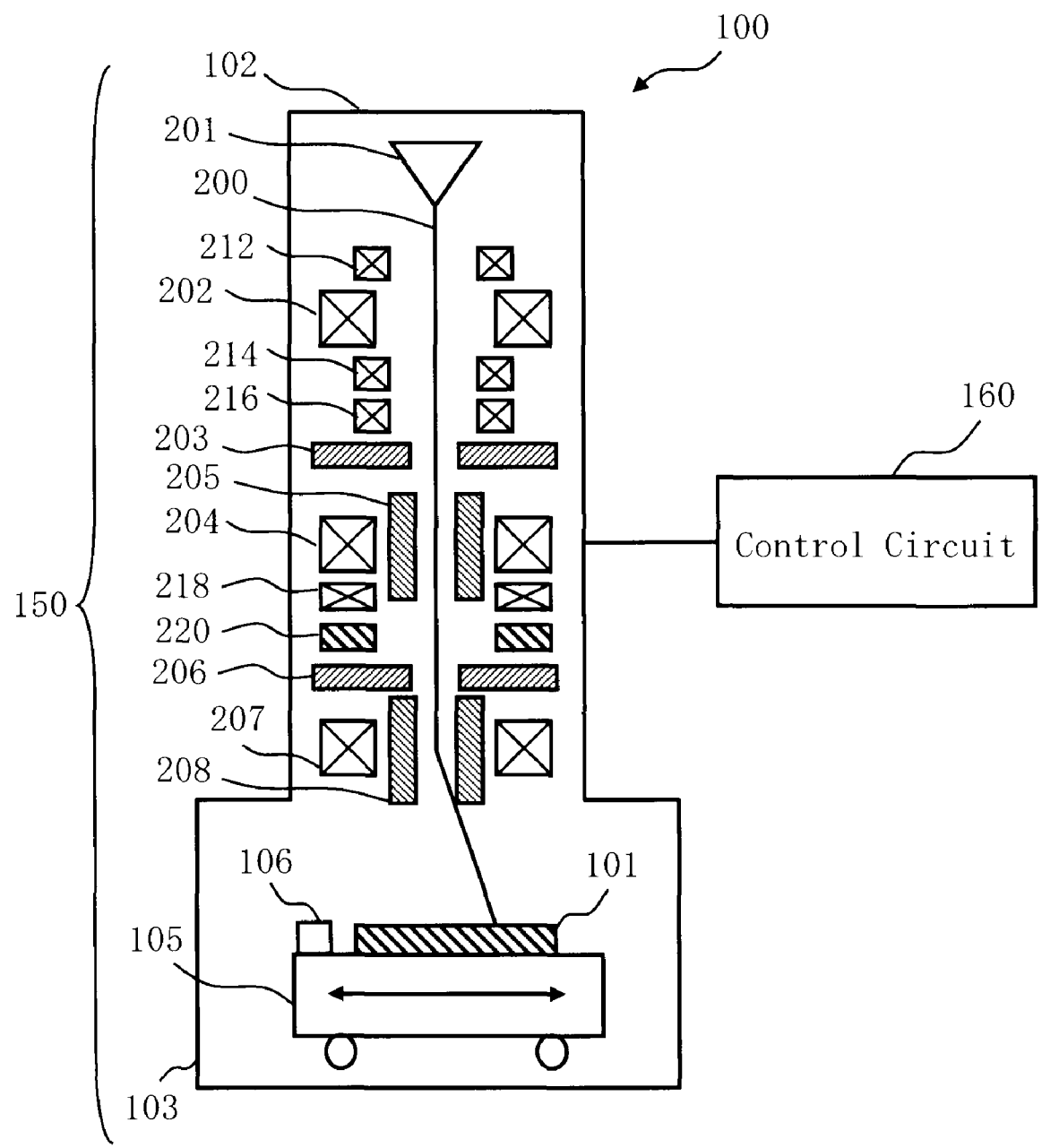
FIG. 1 is a conceptual diagram showing a configuration of a lithography apparatus according to Embodiment 1.

FIG. 1 is a conceptual diagram showing a configuration of a lithography apparatus according to Embodiment 1. In FIG. 1, a lithography apparatus, or "writing apparatus" 100 includes a lithography unit, or "writing unit" 150 and a control unit 160. The lithography apparatus 100 is an example of a charged particle beam lithography apparatus. The lithography apparatus 100 lithographs, or "writes" a predetermined pattern on a workpies 101. The lithography unit 150 includes a lithography chamber or "writing chamber" 103 and an electron lens barrel 102 arranged in an upper part of the lithography chamber 103. In the electron lens barrel 102, an electron gun assembly 201, an illumination lens 202, a first aperture plate member 203, a projection lens 204, a shaping deflector 205, a second aperture plate member 206, an objective lens 207, a deflector 208, alignment coils 212, 214, and 216, an imaging lens 218, and a detector 220. In the lithography chamber 103, an X-Y stage 105 is arranged, and a workpies 101 serving as a lithography target and a Faraday cup 106 are arranged. The workpies 101 includes, for example, an exposing mask which transfers a pattern onto a wafer on which a semiconductor device is to be formed. This mask includes, mask blanks on which any pattern is not formed. In FIG. 1, only components required to explain Embodiment 1 are illustrated. Other configurations generally required for the lithography apparatus 100 may be included.

When a pattern is to be lithographed on the workpies 101, the apparatus operates as follows. The electron beam 200 emitted from the electron gun assembly 201 (irradiating unit) illuminates an entire area of the first shaping aperture plate member 203 having a quadrangular, for example, rectangular hole with the illumination lens 202. In this case, the electron beam 200 is caused to pass through the opening of the first shaping aperture plate member 203 to shape the electron beam 200 into a quadrangular, for example, rectangular shape. The electron beam 200 of a first aperture image having passed through the first aperture plate member 203 is projected on the second shaping aperture plate member 206 by the projection lens 204. A focal point of the electron beam 200 having passed through the first shaping aperture plate member 203 is controlled by the imaging lens 218 arranged between the first shaping aperture plate member 203 and the second shaping aperture plate member 206. In this manner, the first aperture image is focused on the second shaping aperture plate member 206. The position of the first aperture image on the second shaping aperture plate member 206 is deflected by an electrostatic shaping deflector 205 arranged between the first and second aperture plate members to make it possible to change a beam shape and a beam size. The electron beam 200 of the second aperture image having passed through the second shaping aperture plate member 206 is focused by the objective lens 207, deflected by the deflector 208, and irradiated on a desired position of the workpies 101 on the X-Y stage 105 which is movably arranged.

In this case, in order to precisely shape the electron beam 200, the focal point of the first aperture image having passed through the first shaping aperture plate member 203 is required to be adjusted to an upper surface of the second shaping aperture plate member 206. In Embodiment 1, a focusing method between the first shaping aperture plate member 203 and the second shaping aperture plate member 206 in an imaging system will be described below.

Figure 2:
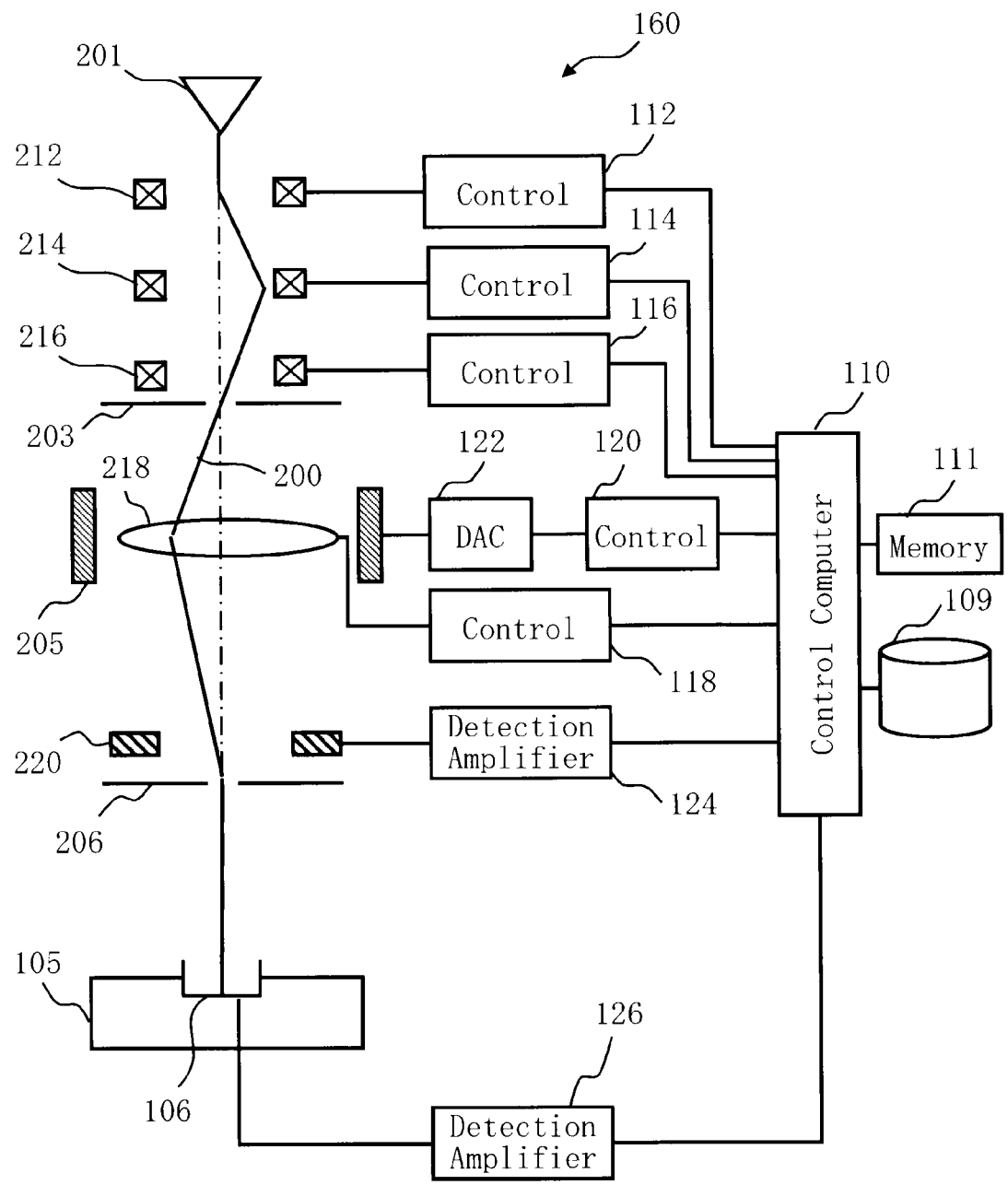
FIG. 2 is a conceptual diagram showing a part of a lithography apparatus obtained by extracting a configuration used in a focusing method for an electron beam in Embodiment 1.

FIG. 2 is a conceptual diagram showing a part of a lithography apparatus obtained by extracting a configuration used in the focusing method for an electron beam according to Embodiment 1. In FIG. 2, the control unit 160 in FIG. 1 includes a control computer 110, a memory 111, a magnetic disk device 109, control circuits 112, 114, 116, 118, and 120, a digital/analog converter (DAC) 122, and detection amplifiers 124 and 126. The control computer 110, the memory 111, the magnetic disk device 109, the control circuits 112, 114, 116, 118, and 120, and the detection amplifiers 124 and 126 are connected to each other through a bus (not shown). The control circuit 112 is connected to the alignment coil 212 (first coil) and outputs a current to deflect the electron beam 200 to the alignment coil 212. The control circuit 114 is connected to the alignment coil 214 (second coil) and outputs a current to deflect the electron beam 200 to the alignment coil 214. The control circuit 116 is connected to the alignment coil 216 (third coil) and outputs a current to deflect the electron beam 200 to the alignment coil 216. The control circuit 118 is connected to the imaging lens 218 and outputs a current to focus the electron beam 200 on the imaging lens 218. The control circuit 120 is connected to the DAC 122 and outputs a digital signal representing an amount of deflection to deflect the electron beam 200. The digital signal is converted into an analog deflection voltage by the DAC 122, amplified by an amplifier (not shown), and then applied to the shaping deflector 205. The control computer 110 controls the control circuits 112, 114, 116, 118, and 120, receives output signals from the detection amplifiers 124 and 126 to use in a calculation. Information input to the control computer 110 or pieces of information in calculating processing and after calculating processing are stored in the memory 111 each time the processing is performed in each case. In FIG. 2, only components required to explain the focusing method for an electron beam in Embodiment 1 are illustrated.

The alignment coil 212 is arranged between the electron gun assembly 201 and the first aperture plate member 203. The alignment coil 212 deflects the electron beam 200 irradiated from the electron gun assembly 201 from a position on an optical axis indicated by an alternate long and short dash line to the outside. The alignment coil 214 is arranged between the alignment coil 212 and the first aperture plate member 203. The alignment coil 214 deflects the electron beam 200 temporarily deflected to the outside by the alignment coil 212 to cause the electron beam 200 to pass through the center of the opening of the first aperture plate member 203. In other words, the alignment coils 212 and 214 temporarily deflect the electron beam 200, change the direction of the electron beam 200 after the temporarily deflecting, and deflect the electron beam 200 to a position where the electron beam 200 passes through the opening center of the first aperture plate member 203 by the changing. In this manner, the beam is temporarily swung to the outside and swung back to the opening center of the first aperture plate member 203. A combination of a current value $C_{1i}$ flowing into the alignment coil 212 and a current value $C_{2i}$ flowing into the alignment coil 214, which generates such relationship of deflections, is calculated in advance. For example, an interlocking ratio of the current value $C_{1i}$ and the current value $C_{2i}$ is preferably calculated in advance. When one of the values is determined, the interlocking ratio is multiplied by the one value to so as to determine the other value. It can be confirmed as follows whether the electron beam 200 is swung back to the opening center of the first aperture plate member 203 by the combination of the current value $C_{1i}$ and the current value $C_{2i}$. The current value $C_{1i}$ and the current value $C_{2i}$ are appropriately set first. The current values may be set to values that are supposed to cause the electron beam 200 to pass the opening of the first aperture plate member 203. In this case, without applying voltage applied to the shaping deflector 205 as will be described below, the electron beam 200 having passed through the first aperture plate member 203 is irradiated to a position misaligned from the opening of the second shaping aperture plate member 206. In this state, the electron beam 200 is scanned by the alignment coil 216, and reflected electrons reflected by the second aperture plate member 206 are detected by the detector 220. An output signal from the detector 220 is amplified by the detection amplifier 124 and output to the control computer 110. In the control computer 110, a position of the first aperture image detected is measured. The current value $C_{2i}$ is controlled so as to locate the first aperture image at the opening center of the first aperture plate member 203. When the current value $C_{2i}$ is controlled in this manner, the combination of the current value $C_{1i}$ and the current value $C_{2i}$ is determined. When one combination is determined, the ratio therebetween can be acquired as an interlocking ratio. Subsequently, even when the current value $C_{1i}$ is changed, the current value $C_{2i}$ can be calculated by multiplying the interlocking ratio by the current value $C_{1i}$ (or dividing the interlocking ratio by the current value $C_{1i}$).

Figure 3:
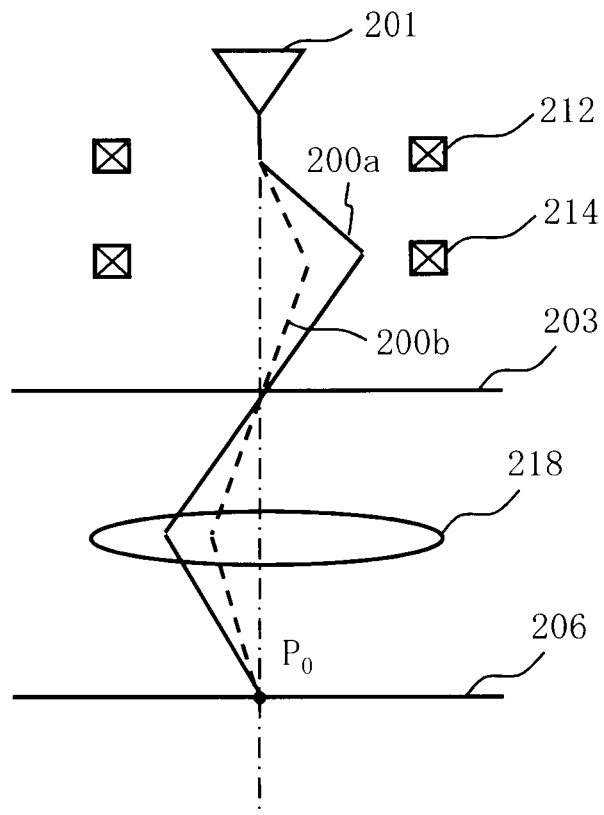
FIG. 3 is a diagram showing an example of a state in which a focal position in Embodiment 1 is located on a second aperture plate member.

FIG. 3 is a diagram showing an example of a state in which the focal position in Embodiment 1 is located on the second aperture plate member. In FIG. 3, the first aperture image of the electron beam 200 having passed through the opening center of the first aperture plate member 203 is focused on a certain focal position according to a lens value (current value) set in the imaging lens 218. In this case, when the focal position of the electron beam 200 is ideally located on the second aperture plate member 206 by the imaging lens 218 with the set lens value, even though the combination of the current value $C_{1i}$ and the current value $C_{2i}$ set in the alignment coils 212 and 214 is changed into another combination, the beam is focused on a position $P_0$ on the second aperture plate member 206. For this reason, the beam position does not change. IN FIG. 3, a trace of an electron beam 200a obtained by a combination of a current value $C_{11}$ and a current value $C_{21}$ is indicated by a solid line, and a trace of an electron beam 200b obtained by a combination of a current value $C_{12}$ and a current value $C_{22}$ is indicated by a dotted line. In this manner, even when swing width of the electron beams 200 obtained by the alignment coils 212 and 214 are changed, beam positions are matched with each other at the focal position. For this reason, when the focal position is on the second aperture plate member 206, the positions of the electron beam 200a and the electron beam 200b are matched with each other on the second aperture plate member 206. In contrast to this, when the focal position is not on the second aperture plate member 206, i.e., the focal positions are not matched with each other, the following state is obtained.

Figure 4:
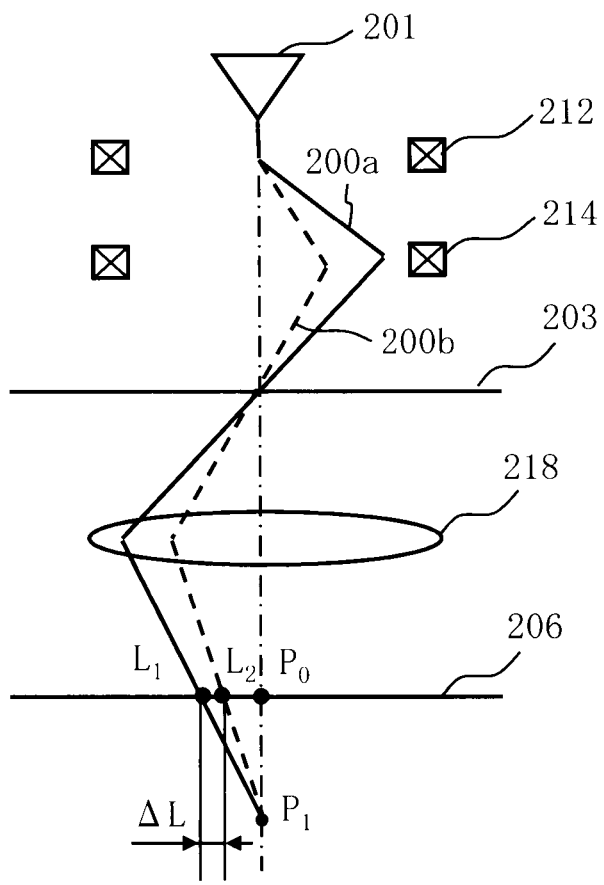
FIG. 4 is a diagram showing an example of a state in which a focal position in Embodiment 1 is misaligned from an upper surface of the second aperture plate member.

FIG. 4 is a diagram showing one example of a state in which the focal position in Embodiment 1 is misaligned from an upper surface of the second aperture plate member. In FIG. 4, a beam trace obtained when a focal position of the electron beam 200 is at the position $P_1$ misaligned downward from a position $P_0$. When the swing width of the electron beam 200 obtained by the alignment coils 212 and 214 are made different from each other, different beam traces are obtained, but the beam positions are matched with each other at the focal position as described above. Therefore, the electron beam 200a and the electron beam 200b are located at a same position $P_1$. For this reason, on the second aperture plate member 206, the electron beam 200a and the electron beam 200b are located at different positions. In FIG. 4, the position of the electron beam 200a on the second aperture plate member 206 is indicated by $L_1$, and the position of the electron beam 200b on the second aperture plate member 206 is indicated by $L_2$. The difference is indicated by $\Delta L$.

Therefore, a focusing operation can be performed by acquiring a lens value of the imaging lens 218 at which a smaller difference $\Delta L$ can be obtained when the swing width of the electron beams 200 obtained by the alignment coils 212 and 214 are made different from each other, and setting the acquired lens value in the imaging lens 218. A beam position is defined in an x direction and a y direction. However, in order to easily understand technical contents, a beam position in one direction is described here. Alternatively, a $\Delta L$ component in the x direction is indicated by $\Delta L_x$ and a $\Delta L$ component in the y direction is indicated by $\Delta L_y$, and a lens value of the imaging lens 218 at which $\Delta L_x^2 + \Delta L_y^2$ is minimum is preferably defined as a set value. The above method is realized. The method will be described below along a flow chart.

Figure 5:
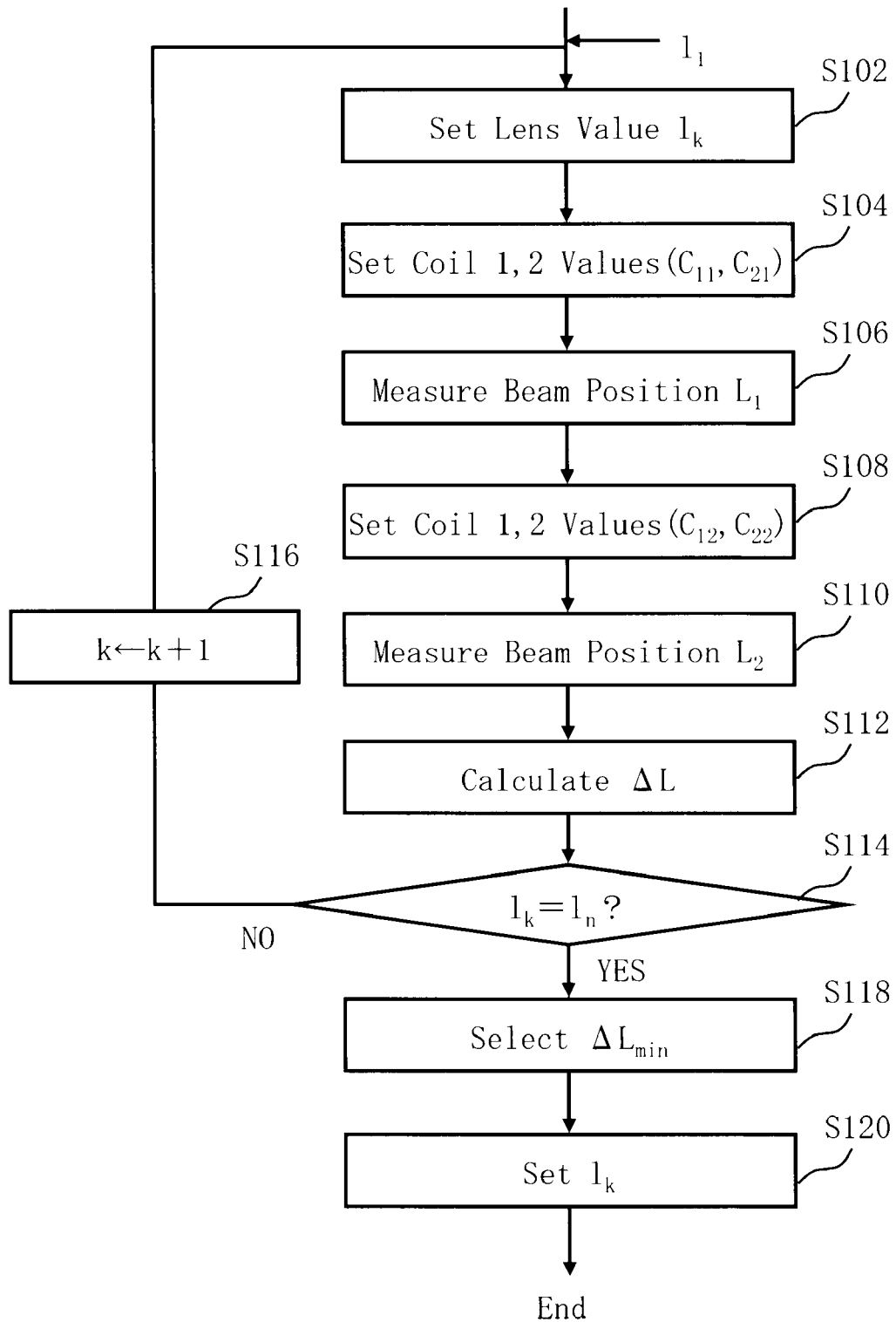
FIG. 5 is a flow chart showing main steps in the focusing method for an electron beam according to Embodiment 1.

FIG. 5 is a flowchart showing main steps of the focusing method for an electron beam according to Embodiment 1.

In step (S) 102, a lens value (current value) $l_k$ is set in the imaging lens 218. An initial value $l_1$ is set first.

In S104, coil values (current values) ($C_{11}$, $C_{21}$) are set in the alignment coils 212 and 214 (coils 1 and 2). When the current value $C_{11}$ and the current value $C_{21}$ are set, the electron beam 200 is temporarily swung outside depending on the respective sets of amounts of deflection of the alignment coils 212 and 214 and then swung back to the opening center of the first aperture plate member 203, as a matter of course.

In S106, a position of the electron beam 200 on the second aperture plate member 206 is measured. The electron beam 200 having passed through the opening center of the first aperture plate member 203 is focused by the imaging lens 218 on a focal position determined by the lens value $l_k$ set in the imaging lens 218. On the second aperture plate member 206, the electron beam is irradiated on the position $L_1$ shown in FIG. 4. Therefore, the beam position $L_1$ is measured. As a method of measuring the beam position, the following method is preferably used.

Figure 6:
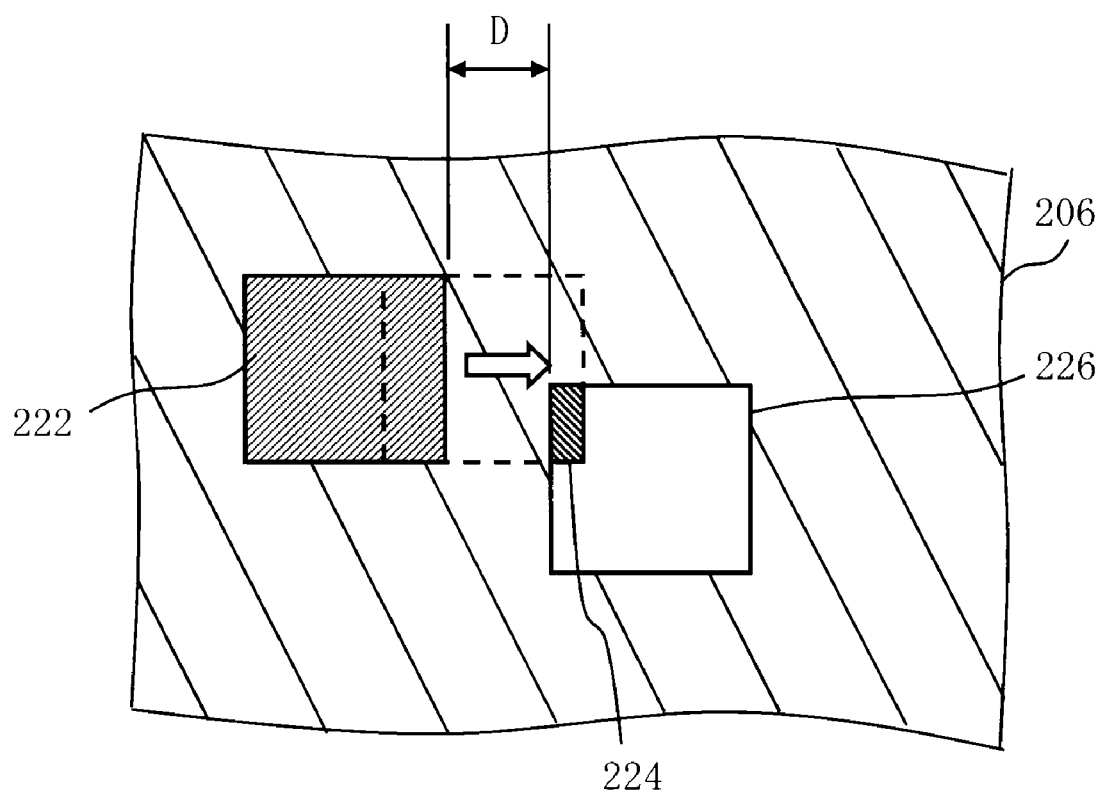
FIG. 6 is a conceptual diagram for explaining a method of measuring a position of an electron beam in Embodiment 1.

FIG. 6 is a conceptual diagram for explaining a method of measuring a position of an electron beam in Embodiment 1. The apparatus is configured in such a manner that when a deflection voltage is not applied to the shaping deflector 205, a first aperture image 222 having passed through the opening center of the first aperture plate member 203 is irradiated on a position which does not overlap an opening 226. In FIG. 6, the position is indicated by a sold line. An amount of deflection of the shaping deflector 205 is changed to direct the first aperture image 222 to the opening 226. Accordingly, the first aperture image 222 gets closer to the opening 226. When the first aperture image 222 begins to overlap the opening 226, the electron beam 200 begins to pass through the second aperture plate member 206. The electron beam 200 having passed through the second aperture plate member 206 is received by the Faraday cup 106 (detector) to detect a current of the electron beam 200. An output signal from the Faraday cup 106 is amplified by the detection amplifier 126 and output to the control computer 110. In this case, a moving distance of the first aperture image 222 until the first aperture image 222 begins to overlap the opening 226 can be calculated from the deflection voltage (amount of deflection) applied to the shaping deflector 205 when the Faraday cup 106 detects the electron beam 200. The control computer 110 calculates the position $L_1$ of the electron beam 200 on the second aperture plate member 206 from the moving distance. In this manner, the control computer 110 calculates the position $L_1$ by using the current value of the electron beam detected and the amount of deflection of the electron beam 200 obtained by the shaping deflector 205. As a matter of course, the control computer 110 may calculate the position $L_1$ from a deflection voltage (amount of deflection) applied to the shaping deflector 205 when the Faraday cup 106 detects the electron beam 200.

In S108, coil values ($C_{12}$, $C_{22}$) at which one of sets of amounts of deflection different from the coil values ($C_{11}$, $C_{21}$) are set in the alignment coils 212 and 214 (coils 1 and 2), respectively. When the current value $C_{12}$ and the current value $C_{22}$ are set, the electron beam 200 is temporarily swung out depending on the sets of amounts of deflection of the alignment coils 212 and 214, and then swung back to the opening center of the first aperture plate member 203, as a matter of course.

In S110, a position of the electron beam 200 on the second aperture plate member 206 is measured. The electron beam 200 having passed through the opening center of the first aperture plate member 203 is focused by the imaging lens 218 on a focal position determined by the lens value $l_k$ set in the imaging lens 218. On the second aperture plate member 206, the electron beam is irradiated on the position $L_2$ shown in FIG. 4. Therefore, the beam position $L_2$ is measured. As a method of measuring the beam position, the above method is used.

In S112, the control computer 110 calculates the difference $\Delta L$ between the positions of the electron beam 200 on the second aperture plate member 206 obtained by different sets of amounts of deflections at a same focal position $P_1$ when combinations of one of the focal positions of the electron beam 200 controlled by the imaging lens 218 and one of sets of the amounts of deflections of the electron beam 200 obtained by the alignment coils 212 and 214 is changed. More specifically, $\Delta L=|L_1-L_2|$ is calculated. The calculation result is stored in the magnetic disk device 109 together with the lens value (current value) $l_k$.

In Embodiment 1, the difference $\Delta L$ between positions of the electron beam 200 obtained when one of sets of amounts of deflection of the electron beam 200 obtained by the alignment coils 212 and 214 is changed for each of the focal positions of the electron beam 200 controlled by the imaging lens 218 is calculated. Then, the focal position of the electron beam 200 controlled by the imaging lens 218 is changed.

In S114, the control computer 110 determines whether the set lens value $l_k$ becomes a setting limit $l_n$. The lens value $l_k$ is sequentially changed from $l_1$ to $l_n$ within the range given by $l_1 < l_k < L_n$. When the lens value $l_k$ does not become the setting limit $l_n$, the operation proceeds to S116.

In S116, the control computer 110 adds 1 to the value k of the lens value $l_k$. The operation returns to S102.

Until the set lens value $l_k$ becomes the setting limit $l_n$, similarly, the steps S102 to S116 are repeated. In this manner, the control computer 110 calculates the difference $\Delta L$ between positions of the electron beam 200 when one of sets of amounts of deflection of the electron beam 200 obtained by the alignment coils 212 and 214 is changed for each of focal positions of the electron beam 200 controlled by the imaging lens 218. At each of the focal positions, the values $L_1$ and $L_2$ are calculated by using the current value of the electron beam detected and the amount of deflection of the electron beam 200 obtained by the shaping deflector 205. For this reason, consequently, the control computer 110 uses the current value of the electron beam detected and the amount of deflection of the electron beam 200 obtained by the shaping deflector 205 to calculate the difference $\Delta L$ between the positions of the electron beam 200 on the second aperture plate member 206.

In S118, the control computer 110 reads the difference $\Delta L$ between the positions of the electron beam 200 calculated at each of the focal positions, in other words, each of the set lens values $l_k$ from the magnetic disk device 109 and selects a minimum value $\Delta L$min from a plurality of differences $\Delta L$. In this case, as described above, since the differences $\Delta L$ between the positions of the electron beam 200 are present in the x direction and the y direction, a minimum sum of sequences of a value $\Delta Lx$ in the x direction and a value $\Delta Ly$ in the y direction is preferably used as the minimum value $\Delta L$min. Alternatively, when the minimum value $\Delta L$min is selected with more precision, the following operation is more preferably performed.

Figure 7:
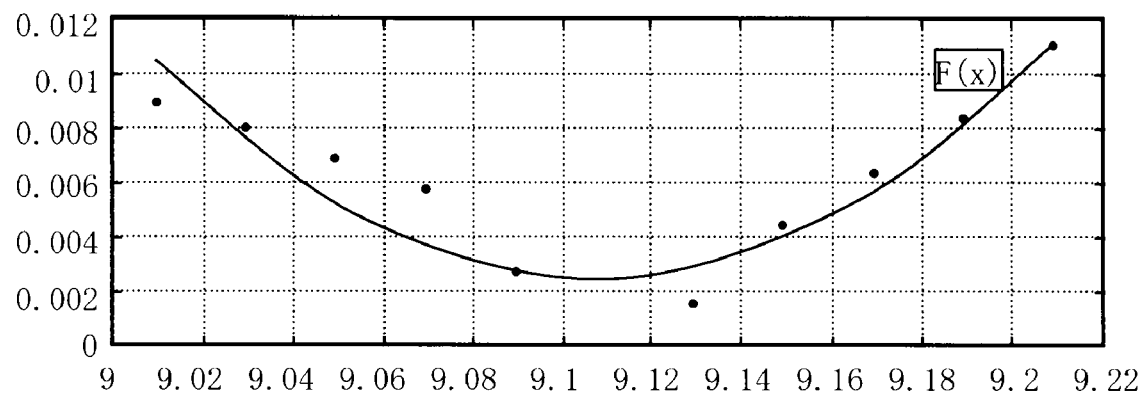
FIG. 7 is a diagram for explaining an example of a relationship between ΔL and a focal position in Embodiment 1.

FIG. 7 is a diagram showing an example of a relationship between the difference $\Delta L$ and the focal position in Embodiment 1. In FIG. 7, the abscissa indicates the lens value $l_k$, and the ordinate indicates the sum of squares of the value $\Delta Lx$ in the x direction and the value $\Delta Ly$ in the y direction. The control computer 110 reads the difference $\Delta L$ between the positions of the electron beam 200 calculated for each of the set lens values $l_k$ from the magnetic disk device 109 and approximates (fitting) a sum of squares of the values $\Delta Lx$ and $\Delta Ly$ with a polynomial equation F (x). A point at which an inclination of an approximated curve indicated by the polynomial equation F (x) is zero, i.e., the minimum value of the sum of squares of the values $\Delta Lx$ and $\Delta Ly$ is defined as $\Delta L$min. In this manner, when the value is calculated from the approximated curve, an influence caused by a fluctuation in measurement can be reduced. As the polynomial equation F (x), for example, a quadratic function (F (x)=$ax^2+bx+c$) is preferably used. As a matter of course, as the polynomial equation, not only a quadratic function but also any approximated polynomial equation may be used.

In S120, the control computer 110 outputs a signal to the control circuit 118 to set the lens value $l_k$, which is the minimum value $\Delta L$min, in the imaging lens 218. The control circuit 118 sets the lens value $l_k$, which is the minimum value $\Delta L$min, in the imaging lens 218. In this manner, the focal point of the electron beam 200 is adjusted to a focal position where the difference between the positions of the electron beam 200 obtained by the different sets of amounts of deflection obtained by the alignment coils 212 and 214 at a same focal position is smaller. For example, in calculation of the minimum value $\Delta L$min, as shown in FIG. 7, when fitting is performed by a quadratic function (F(x)=$ax^2+bx+c$), a lens value corresponding to a value x, which satisfies a differential function of the F (x):F (x)'=$2ax+b=0$, is defined as the lens value $l_k$, which is the minimum value ΔLmin. In this manner, on the basis of a difference between positions of the electron beam obtained by different sets of amounts of deflection at a same focal position, the focal point of the electron beam is adjusted to the focal position where the difference becomes smaller.

As described above, according to the configuration of Embodiment 1, the difference ΔLmin between the positions of the electron beam on the second aperture plate member 206 is calculated under the condition that the focal position of the electron beam controlled by the lens does not change and that the sets of amounts of deflection of the electron beam obtained by the alignment coils 212 and 214 are different from each other. When the set focal position is on the second aperture plate member 206, the difference ideally becomes 0 (zero). Therefore, the focal position of the electron beam may be made variable to find out the focal position of the electron beam at which the difference ΔLmin is minimum. As described above, the electron beam 200 can be focused between the first aperture plate member 203 and the second aperture plate member 206. As a result, the electron beam can be shaped with high precision.

Embodiment 2

In Embodiment 1, the configuration, in which the lens value $l_k$ is set at a constant and the coil values ($C_{1i}$, $C_{2i}$) of the alignment coils 212 and 214 are changed, is described. In Embodiment 2, on the contrary, a configuration, in which the coil values ($C_{1i}$, $C_{2i}$) are set as constants and the lens value $l_k$ is changed, will be described. The configuration of the lithography apparatus 100 is the same as that in FIG. 1. A configuration used in a focusing method for the electron beam 200 is the same as that in FIG. 2.

Figure 8:
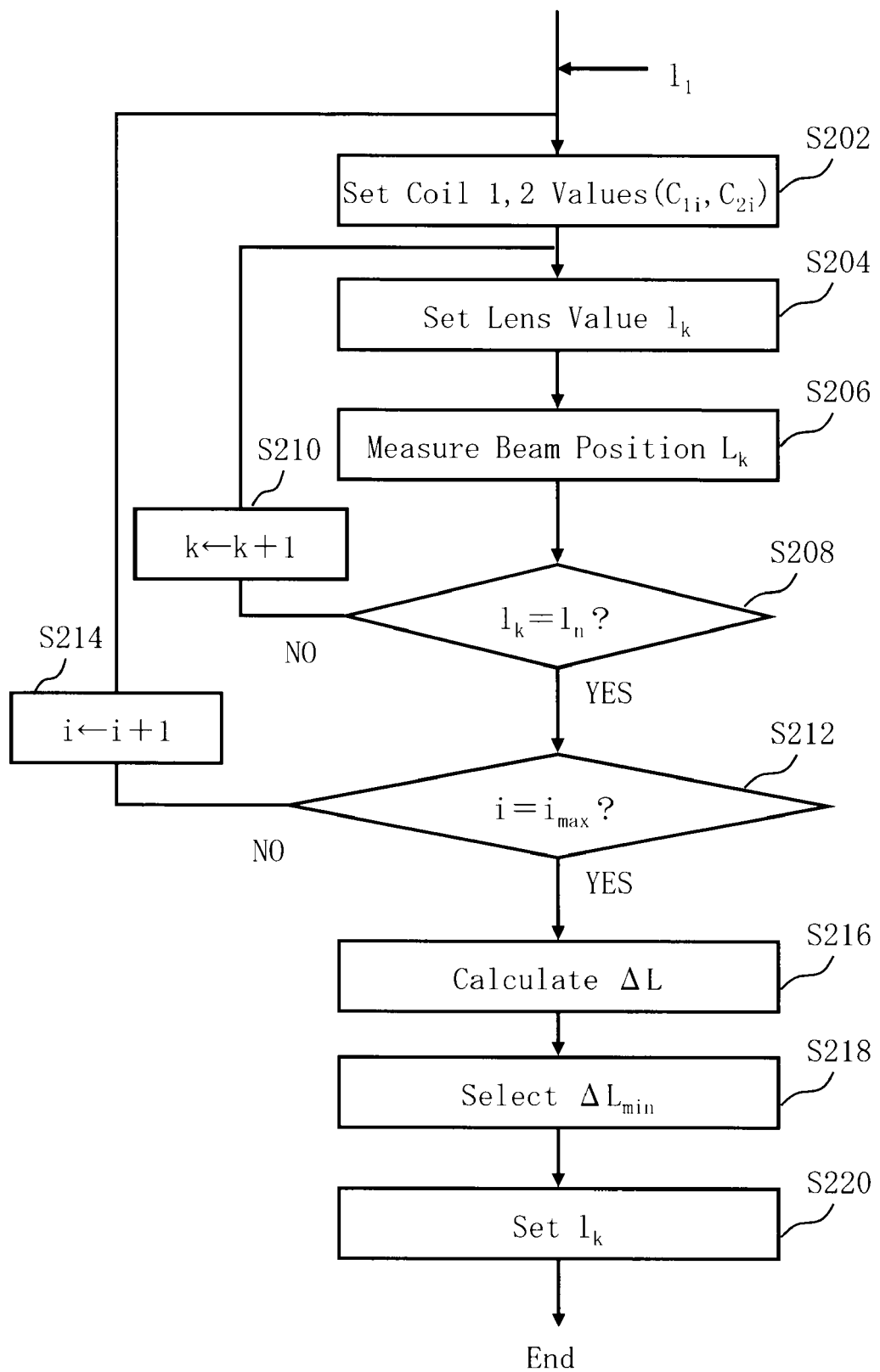
FIG. 8 is a flow chart showing main steps of a focusing method for an electron beam according to Embodiment 1.
Figure 9:
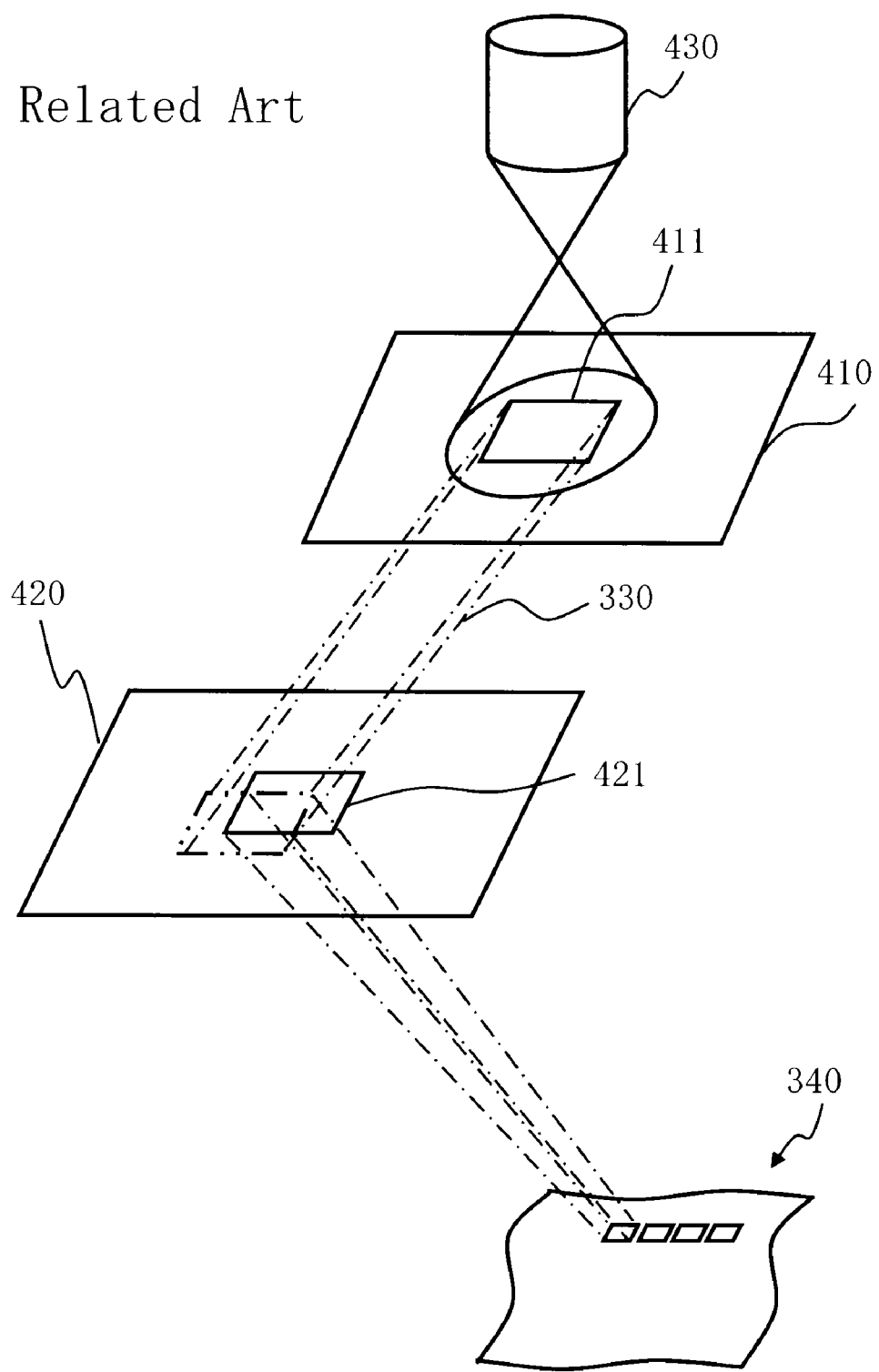
FIG. 9 is a conceptual diagram for explaining an operation of a variable-shaped electron beam lithography apparatus.

FIG. 8 is a flow chart showing main steps of a focusing method for an electron beam according to Embodiment 2.

In S202, the coil values (current values) ($C_{1i}$, $C_{2i}$) are set in the alignment coils 212 and 214 (coils 1 and 2). First, initial values ($C_{11}$, $C_{21}$) are set. When the current value $C_{1i}$ and the current value $C_{2i}$ are set, the electron beam 200 is temporarily swung outside depending on the set of amounts of deflection of the alignment coils 212 and 214 and then swung back to the opening center of the first aperture plate member 203, as a matter of course.

In S204, the lens value (current value) $l_k$ is set in the imaging lens 218. The initial value $l_1$ is set first.

In S206, a position $L_k$ of the electron beam 200 on the second aperture plate member 206 is measured. A method of measuring a beam position is the same as that in Embodiment 1.

In S208, the control computer 110 determines whether the set lens value $l_k$ becomes a setting limit $l_n$. The lens value $l_k$ is sequentially changed from $l_1$ to $l_n$ within the range given by $l_1 < l_k < L_n$. When the lens value $l_k$ does not become the setting limit $l_n$ the operation proceeds to S210. When the lens value $l_k$ becomes the setting limit $l_n$, the operation proceeds to S212.

In S210, the control computer 110 adds 1 to the value k of the lens value $l_k$. The operation returns to S204.

Until the set lens value $l_k$ becomes the setting limit $l_n$, similarly, the steps S204 to S210 are repeated. The positions $L_k$ of the electron beam 200 measured for the respective lens values $l_k$ are stored in the magnetic disk device 109.

In S212, the control computer 110 determines whether a value i of the set coil values ($C_{1i}$, $C_{2i}$) becomes a setting limit imax. The value i is sequentially changed from 1 to imax within the range given by 1<i<imax. When the value i of the coil values ($C_{1i}$, $C_{2i}$) does not become the setting limit imax, the operation proceeds to S214. When the value i of the coil values ($C_{1i}$, $C_{2i}$) become the setting limit imax, the operation proceeds to S216. The setting limit is satisfactorily given by imax=2.

In S214, the control computer 110 adds 1 to the value i of the coil values ($C_{1i}$, $C_{2i}$). The operation returns to S202.

Until the set coil values ($C_{1i}$, $C_{2i}$) become coil values ($C_{1imax}$, $C_{2imax}$) of the setting limit, similarly, the steps S202 to S214 are repeated. The measured positions $L_k$ of the electron beam 200 are stored in the magnetic disk device 109.

As described above, the positions $L_k$ of the electron beam 200 obtained when the focal positions of the electron beam 200 controlled by the imaging lens 218 are changed for each of the sets of amounts of deflection of the electron beam 200 controlled by the alignment coils 212 and 214 are measured.

In S216, the control computer 110 calculates the difference ΔL between the positions of the electron beam 200 on the second aperture plate member 206 obtained by the different sets of amounts of deflection obtained by the alignment coils 212 and 214 at a same focal position. More specifically, $\Delta L = |L_1 - L_2|$ is calculated. The calculation result is stored in the magnetic disk device 109 together with the lens value (current value) $l_k$.

In S218, the control computer 110 reads the difference ΔL between the positions of the electron beam 200 from the magnetic disk device 109 and selects a minimum value ΔLmin from a plurality of differences ΔL. In this case, as described above, since the differences ΔL between the positions of the electron beam 200 are present in the x direction and the y direction, a minimum sum of squares of a value ΔLx in the x direction and a value ΔLy in the y direction is preferably used as the minimum value ΔLmin. Alternatively, as described in FIG. 7, the sum of squares of the values ΔLx and ΔLy may be approximated (fitting) with the polynomial equation. A point at which an inclination of a graph given by the polynomial equation F (x) is 0, which is, the minimum value of the sum of squares of the values ΔLx and ΔLy is more preferably defined as ΔLmin.

In S220, the control computer 110 outputs a signal to the control circuit 118 to set the lens value $l_k$, which is the ΔLmin, in the imaging lens 218. The control circuit 118 sets the lens value $l_k$, which is the ΔLmin, in the imaging lens 218. In this manner, the focal point of the electron beam 200 is adjusted to a focal position where the difference between the positions of the electron beam 200 obtained by the different sets of amounts of deflection obtained by the alignment coils 212 and 214 at a same focal position is smaller.

As described above, in Embodiment 2, the difference ΔL between the positions of the electron beam 200 obtained when the one of focal positions of the electron beam 200 controlled by the imaging lens 218 is changed for each of the sets of amounts of deflection of the electron beam 200 controlled by the alignment coils 212 and 214 is calculated. By performing focusing following the above flow, focusing can also be performed with high precision as in Embodiment 1.

The embodiments are described with reference to the concrete examples. However, the present invention is not limited to the concrete examples.

Parts of the apparatus configuration, the control method, and the like which are not directly required for the explanation of the present invention are not described. However, a necessary apparatus configuration and a necessary control method can be appropriately selected and used. For example, a control unit configuration which controls the lithography apparatus 100 is not described. However, a necessary control unit configuration is appropriately selected and used, as a matter of course.

In addition, all lithography apparatuses and focusing methods for a charged particle beam which include components of the invention and can be obtained by appropriately changing in design by a person skilled in the art are included in the scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A focusing method for a charged particle beam comprising:
   setting a lens value in an imaging lens;
   setting first coil values in first and second alignment coils, wherein a charged particle beam is temporarily swung outside and then swung back to an opening center of a first aperture plate member by deflection of the first and second alignment coils in which the first coil values have been set;
   measuring a first position of the charged particle beam focused by the imaging lens in which the lens value has been set, on a second aperture plate member, wherein the charged particle beam having passed through the opening center of the first aperture plate member by deflection of the first and second alignment coils in which the first coil values have been set is focused on a position which is different from a position on the second aperture plate member, by the imaging lens in which the lens value has been set;
   setting second coil values in the first and second alignment coils, wherein the charged particle beam is temporarily swung outside and then swung back to the opening center of the first aperture plate member by deflection of the first and second alignment coils in which the second coil values have been set and an amount of deflection of the first and second alignment coils in which the second coil values have been set is different from an amount of deflection of the first and second alignment coils in which the first coil values have been set;
   measuring a second position of the charged particle beam focused by the imaging lens in which the lens value has been set, on the second aperture plate member, wherein the charged particle beam having passed through the opening center of the first aperture plate member by deflection of the first and second alignment coils in which the second coil values have been set is focused on a position which is different from a position on the second aperture plate member, by the imaging lens in which the lens value has been set; and
   calculating a difference between the first and second positions of the charged particle beam on the second aperture plate member;
   wherein the lens value is variably changed, and a plurality of the differences are calculated depending on the lens values variably changed; and
   further comprising: setting a lens value which corresponds to a minimum difference of the plurality of the differences, in the imaging lens.

2. The method according to claim 1, wherein the first and second coils are arranged above the first aperture plate member.

3. The method according to claim 1, wherein the imaging lens is arranged between the first and second aperture plate members.

4. The method according to claim 1, further comprising:
   detecting a current of the charged particle beam having passed through the second aperture plate member when amounts of deflection of the charged particle beam obtained by the first and second alignment coils are changed for each of focal positions of the charged particle beam controlled by the lens.

5. The method according to claim 4, wherein the difference between the first and second positions is calculated by using a current value of the charged particle beam detected and an amount of deflection of the charged particle beam obtained by a deflector.

6. The method according to claim 1, wherein a ratio of coil values is used when the first coil values are set in the first and second alignment coils.

7. The method according to claim 6, wherein a coil value setting in one of the first and second alignment coils is calculated by multiplying the ratio by a current value of another of the first and second alignment coils.

8. The method according to claim 1, wherein when the lens value is variably changed, a position focused by the imaging lens is adjusted to a focal position where the difference between the first and second positions is made smaller.

9. The method according to claim 1, wherein the difference between the first and second positions is calculated in directions of two-dimensional directions on the second aperture plate member.

10. A focusing method for a charged particle beam comprising:
    setting first coil values in first and second alignment coils, wherein a charged particle beam is temporarily swung outside and then swung back to an opening center of a first aperture plate member by deflection of the first and second alignment coils in which the first coil values have been set;
    setting a lens value in an imaging lens; and
    measuring a first position of the charged particle beam focused by the imaging lens in which the lens value has been set, on a second aperture plate member, wherein the charged particle beam having passed through the opening center of the first aperture plate member by deflection of the first and second alignment coils in which the first coil values have been set is focused on a position which is different from a position on the second aperture plate member, by the imaging lens in which the lens value has been set;
    wherein the lens value is variably changed, and a plurality of the first positions are calculated depending on the lens values variably changed;
    further comprising:
    setting second coil values in the first and second alignment coils, wherein the charged particle beam is temporarily swung outside and then swung back to the opening center of the first aperture plate member by deflection of the first and second alignment coils in which the second coil values have been set and an amount of deflection of the first and second alignment coils in which the second coil values have been set is different from an amount of deflection of the first and second alignment coils in which the first coil values have been set;
    setting the lens value in the imaging lens; and
    measuring a second position of the charged particle beam focused by the imaging lens in which the lens value has been set, on the second aperture plate member, wherein the charged particle beam having passed through the opening center of the first aperture plate member by deflection of the first and second alignment coils in which the second coil values have been set is focused on a position which is different from a position on the second aperture plate member, by the imaging lens in which the lens value has been set;

wherein the lens value is variably changed, and a plurality of the second positions are calculated depending on the lens values variably changed;

further comprising:

calculating a plurality of differences, each of the plurality of differences being a difference between corresponding positions of the first and second positions on the second aperture plate member; and setting a lens value which corresponds to a minimum difference of the plurality of the differences, in the imaging lens.

* * * * *